United States Patent [19]

Goth et al.

[11] Patent Number: 4,704,368

[45] Date of Patent: Nov. 3, 1987

[54] METHOD OF MAKING TRENCH-INCORPORATED MONOLITHIC SEMICONDUCTOR CAPACITOR AND HIGH DENSITY DYNAMIC MEMORY CELLS INCLUDING THE CAPACITOR

[75] Inventors: George R. Goth, Poughkeepsie; Shashi D. Malaviya, Hopewell Junction, both of N.Y.

[73] Assignee: International Business Machines Corporation, Armonk, N.Y.

[21] Appl. No.: 792,996

[22] Filed: Oct. 30, 1985

[51] Int. Cl.[4] .................. H01L 21/302; H01L 21/76; H01L 21/70

[52] U.S. Cl. ........................... 437/60; 437/67; 437/31; 437/249; 437/919

[58] Field of Search .......... 357/23.6, 51, 55; 148/DIG. 14, DIG. 50; 29/580, 571, 576 C, 577 C; 156/653; 427/79, 80

[56] References Cited

U.S. PATENT DOCUMENTS

| | | | |
|---|---|---|---|
| 3,387,286 | 6/1968 | Dennard | 340/173 |
| 3,876,992 | 4/1975 | Pricer | 340/173 CA |
| 4,017,885 | 4/1977 | Kendall et al. | 357/23.6 |
| 4,225,945 | 9/1980 | Kuo | 365/149 |
| 4,327,476 | 5/1982 | Iwai et al. | 29/571 |
| 4,353,086 | 10/1982 | Jaccodine et al. | 357/51 |
| 4,381,953 | 5/1983 | Ho et al. | 148/1.5 |
| 4,534,826 | 8/1985 | Goth et al. | 156/643 |
| 4,577,395 | 3/1986 | Shibata | 29/576 C |
| 4,645,564 | 2/1987 | Morie et al. | 29/576 |

FOREIGN PATENT DOCUMENTS 0088451 9/1983 European Pat. Off. ........... 357/23.6
0187596 7/1986 Japan .................... 357/23.6

OTHER PUBLICATIONS

C. G. Jambotkar, "Very Dense One-Device Fet Memory Cell", IBM Technical Disclosure Bulletin, vol. 25, No. 2, Jul. 1982, pp. 593-596.

Primary Examiner—Brian E. Hearn
Assistant Examiner—Tom Thomas
Attorney, Agent, or Firm—T. Rao Coca

[57] ABSTRACT

A high density integrated circuit structure, for example a dynamic memory cell, is described which includes an active/passive device in combination with a capacitor structure. The capacitor structure is of the polysilicon-oxide-silicon type and is formed on the sidewalls of a mesa-shaped and dielectrically isolated region of silicon material resulting from the formation of an isolation trench in the silicon. The trench is filled with a plastic material, such as polyimide. The capacitor is formed by the isolated region of silicon material which functions as the first capacitor plate, a doped polysilicon layer provided on the vertical walls of the mesa serving as the second capacitor plate and a thin dielectric layer interposed between the two plates serving as the capacitor's dielectric. Since the polysilicon is wrapped around the periphery of the mesa as a coating on the vertical sidewalls thereof, it gives rise to a large storage capacitance without an increase in the cell size.

9 Claims, 13 Drawing Figures

METHOD OF MAKING TRENCH-INCORPORATED MONOLITHIC SEMICONDUCTOR CAPACITOR AND HIGH DENSITY DYNAMIC MEMORY CELLS INCLUDING THE CAPACITOR

BACKGROUND OF THE INVENTION

The invention relates to semiconductor devices and more particularly to a high capacitance and low-leakage integrated trench capacitor structure and a method for fabricating the same. The method is fully compatible with the advanced semiconductor manufacturing technologies, such as dielectric-filled trench isolation technique to fabricate high density single device memory cells.

Dynamic random access memories have been under active investigation by semiconductor manufacturers. According to the recent developments in this technology, fabrication of high density dynamic memory chips typically requires two device elements per storage cell, an active device (either a bipolar transistor or field effect transistor) and a passive device (e.g., capacitor). U.S. Pat. Nos. 3,387,286 to R. H. Dennard and 3,876,992 to W. D. Pricer, respectively, both of which are assigned to the present assignee, are representative of the prior art teachings of such dynamic memory structures.

In order to meet the ever-demanding requirements of higher integration density and superior performance of these memory structures, it is imperative that the capacitor element possess characteristics (both physical and electrical) which are consistent with these requirements. Among the different parameters which determine these capacitor characteristics, two are of significant importance: the surface area of the capacitor (which not only determines the capacitance but also the number of cells to be integrated in one chip) and leakage currents (which directly impact the ability of the capacitor to store the charge during the time between refresh cycles).

Accordingly, a dynamic memory must have very low PN junction leakage currents in its storage node, even at elevated temperatures, e.g. 100° C. and at the same time should also have a large capacitance in the storage node.

These two requirements tend to be matually exclusive if the charges are stored in one of the PN junctions of the device. The reason is obvious, low leakage calls for lightly doped junctions but high capacitance calls for high doping levels.

For a long time, the storage capacitor for dynamic memory cells consisted of one of the three junctions (emitter-base junction, collector-base junction or collector-substrate junction) associated with a bipolar transistor or the drain-substrate junction associated with a field effect transistor (FET). In the bipolar transistor situation, more specifically in case of a typical NPN device, it is well known that the leakage of the base-emitter junction is 2-3 orders of magnitude higher than that of the collector-base junction. If the charges are stored in the base of a bipolar transistor, they tend to leak away very fast because of the combined leakage of the base-emitter and base-collector junctions. If the charges are stored in the emitter, they are still subject to the high leakage of the emitter-base junction. On the other hand, if the charges are stored in a floating collector it tends to have about three orders of magnitude less leakage than the two other junctions rendering the floating collector as the desirable charge storage medium.

However, it has been recently recognized that a low-leakage and high-capacitance storage node cannot be obtained by utilizing junction capacitances alone and that an additional storage capacitor is necessary. Accordingly, attempts were made to design an additional capacitor in integration with the transistor device and thereby obtaining the basic cell. A metal-oxide-silicon (MOS) type transistor and storage capacitor combination is disclosed in U.S. Pat. No. 4,255,945. In an effort to minimize the consumption of the chip real estate, which is at a premium, the buried polysilicon-oxide-silicon (POS) type storage capacitor has been proposed in the article by C. G. Jambotkar entitled "Very Dense One-Device FET Memory Cell", IBM Technical Disclosure Bulletin Vol. 25, No. 2, pp. 593-596, July 1982. This article discloses a one-device FET cell in which the drain of the FET is connected in series to the POS capacitor.

Both types of these prior art capacitor structures have demonstrated their capability for having relatively low leakage currents as compared to PN junction capacitances in the design of dynamic one-device memory cells. Also, because the POS-type capacitor does not extend over the surface area of the silicon substrate, but instead is integrated vertically, thereby obtaining significant gain in integration density, it has received wide acceptance in the industry.

In this connection, reference is made to U.S. Pat. No. 4,353,086 to R. J. Jaccodine et al. This reference describes a random access memory (RAM) in which individual cells, including an access transistor and a storage capacitor, are formed in mesas formed on a silicon chip. For each cell, the transistor is formed on the top surface of the mesa and the capacitor is formed in the mesa sidewalls. One plate of the storage capacitor is obtained by a doped region formed into the sidewall of the mesa, and the other plate is obtained by doped polycrystalline silicon which fills the groove surrounding the mesa. An insulating layer on the wall of the mesa serves as the capacitor dielectric.

The structure disclosed in Jaccodine et al. although seen as being a significant achievement in the progress of FET dynamic RAMs, it is believed to have a number of disadvantages. Since the isolation grooves are filled with doped polysilicon, the latter acts as a common plate for all capacitors shared by a particular groove. In other words, all the capacitors that share a groove have a common node (which is connected to the ground in that reference). This means that all the capacitors formed on the chip have one plate connected to that common node due to the electrical continuity provided by the polysilicon filling all the grooves of the chip.

From a process standpoint, the Jaccodine et al. process requires a specifically tailored and controlled ion implantation or diffusion step to form the doped regions constituting the one plate of the capacitor. Such a process is unsuitable in a high volume production environment. Also, to prevent formation of parasitic channels in the mesa surface region between the source/drain and the capacitor plate, the patented device requires a channel stop positioned adjacent to the capacitor plate in the mesa surface region. The channel stop-forming step further detracts the process from a high volume and high yield production environment. Yet another drawback of the Jaccodine et al. structure is that, due to the presence of the conductive capacitor plate on the mesa sidewall, the source/drain of the FET cannot be butted against the isolation grooves. Consequently, high integration density cannot be achieved. Finally, the Jaccodine et al. structure must have polysilicon-filled trench isolation, it suffers from the disadvantage associated with polysilicon trench isolation such as generation of defects in the silicon due to thermal mismatch between the trench-fill material and the trench insulator liner and that between the trench liner and the silicon substrate.

Accordingly, it is an object of the invention to provide a high-capacitance and low-leakage integrated capacitor structure and a method for making the same which meets the requirements of manufacturability with acceptable yields.

It is anothe object of the present invention to provide a high-capacitance, low-leakage self-aligned mesa shaped integrated capacitor structure and a method for making the same which is fully compatible with bipolar and/or FET technology with self alignment and abutment capabilities.

It is another object of the present invention to provide a low-leakage, high-capacitance, self-aligned mesa-shaped integrated capacitor structure and a method for making the same which is fully compatible with polyimide-filled deep trench isolation scheme.

It is another object of the present invention to provide a low-leakage, high-capacitance, self-aligned mesa-shaped integrated capacitor and a method for making the same which renders one capacitor electrically independent from other capacitors formed in adjacent mesas, thereby providing the unique design option of connecting capacitors where needed.

It is still another object of the present invention to provide a high density, high performance dynamic memory by incorporating the aforementioned capacitor into a single device memory cell, the active device thereof being either a bipolar or FET or a combination bipolar-FET structure.

It is still another object of the invention to provide a high density, high performance dynamic memory by incorporating the aforementioned capacitor into a single device memory cell with minimal increase in cell area.

It is still another object of the present invention to provide a low-leakage high-capacitance, self-aligned mesa-shaped integrated capacitor structure and a method for making the same which has the capability of selectively providing the capacitor only in the memory cells while not providing a capacitor in the peripheral circuits.

These and other related objects are attained with the high capacitance, low leakage, self aligned mesa shaped integrated capacitor structure of the present invention. The capacitor of the present invention overcomes all the disadvantages of the prior art structures and, in particular, the various problems associated with integrating an active device and a capacitor in a very dense configuration to form high performance dynamic one device cell.

The capacitor structure is of the polysiliconoxide-silicon (POS) type and is formed on the sidewalls of a mesa-shaped silicon regions delineated and surrounded by an isolation trench formed in the silicon material. The mesa-shaped silicon material serves as the first plate of the capacitor. A thin dielectric layer formed on the vertical sidewalls of the mesa serves as the capacitor insulator and a thin conductive polysilicon layer formed directly over the capacitor insulator serves as the second plate of the capacitor. In other words, in a preferred embodiment the thin polysilicon layer is wrapped around the outer peripheral surface of the mesa. Since the second plate of the capacitor is formed as a coating of the vertical sidewalls of the mesa it encompasses a large area. Consequently, it gives rise to a large storage capacitance without increasing the cell size. The essential feature of the invention is that the thin polysilicon layer which acts as the second plate of the capacitor does not fill the trench, but merely wraps around the trench sidewalls. The trench itself is filled with a plastic, low temperature deposition material, such as polyimide for device isolation purposes. In accordance with a more specific aspect of the invention, the silicon substrate is of a first type of conductivity (e.g., P−) which is covered with an epitaxial silicon layer of the opposite type (e.g., N−). The stud- or mesa-shaped locations of the substrate containing the capacitor are provided with a heavily doped buried layer (e.g., N+) which can also be used as a low resistance subcollector of a bipolar transistor located in the silicon stud/mesa. The trench is etched into the substrate penetrating to a desired depth. With this structure, the capacitor is electrically isolated from any PN junction located in adjacent mesas, and in addition, any plate of any capacitor may be connected where needed without the design limitation of having a common connection node.

Integrating the POS capacitor into the sidewalls results in a large storage capacitor because the surface area of the plate is the product of the depth of the trench and the perimeter of the mesa. It is therefore, easy to adjust the capacitance value either by adjusting the top planar dimensions of the mesa, the depth of the trench or both of these parameters. In addition, this particular structure significantly reduces PN junction leakage currents. When the mesa includes an active device, the presence of this capacitor results in little or no increase in the device area thereby obtaining a very dense integrated circuit structure.

BRIEF DESCRIPTION OF THE DRAWINGS

The novel features, elements, process steps and their combinations characteristic of the invention are set forth in the appended claims. The invention itself, however, will be best understood by reference to the detailed description which follows in conjunction with the accompanying drawings, wherein:

DETAILED DESCRIPTION OF THE PREFERRED EMBODIMENTS

Reference is now made to FIGS. 1–13 wherein the successive steps of the various process embodiments of the invention are illustrated in detail. The steps to be disclosed hereafter are illustrative of one technique for implementing the process aspect of the present invention. It will be obvious to those skilled in the microelectronics art that the specific processes for implementing the various steps may be carried out in a number of different ways.

The drawings herein are not drawn to scale. The scale has been changed where needed to clearly show the structure.

In a first preferred embodiment, the invention will be described with reference to fabrication of a bipolar dynamic RAM cell of the single device type. The active device, which is formed in a mesa-shaped silicon region, is a bipolar NPN transistor. The silicon mesa is dielectrically isolated from other adjacent mesas by polyimide-filled deep trenches.

Figure 1:
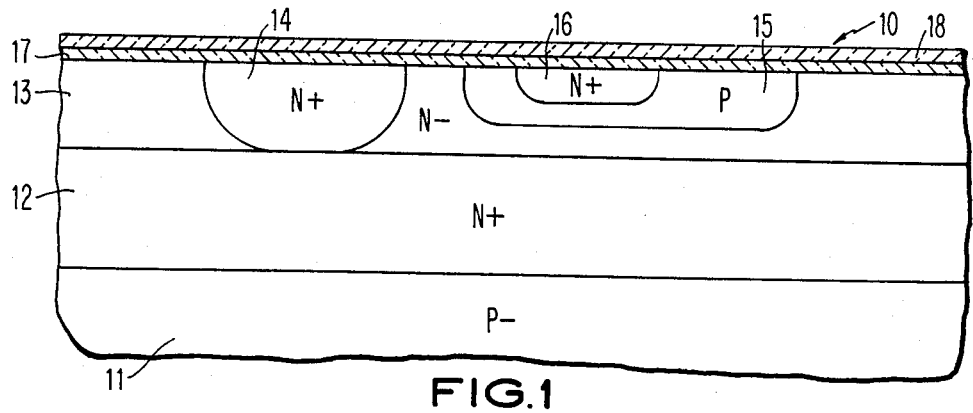
FIG. 1 illustrates a schematic cross-sectional view of a standard bipolar NPN transistor formed by known methods.
Figure 2:
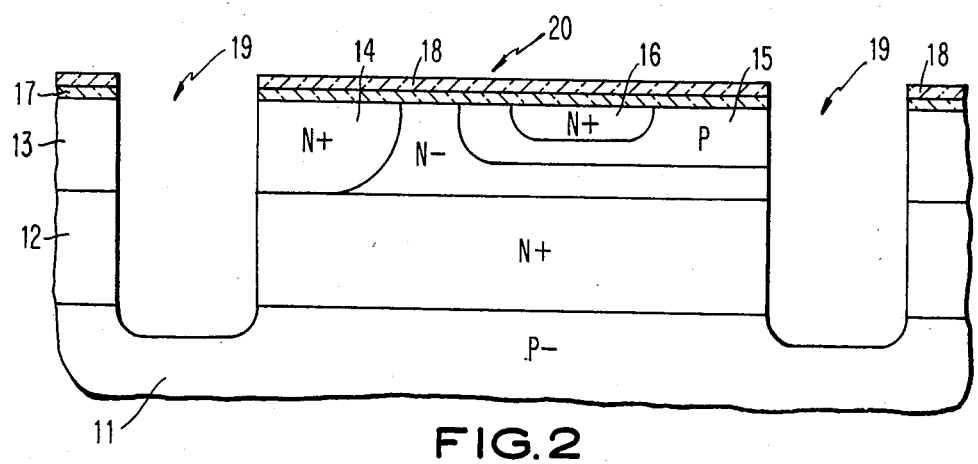
FIGS. 2 through 7 are schematic cross-sectional views showing the formation of an NPN transistor and trench capacitor combination structure at various stages in an illustrative process for fabricating a bipolar dynamic one-device storage cell and a capacitor in accordance with one embodiment of the present invention.

Since conventional bipolar fabrication process is followed through the trench formation stage, the initial processing steps will not be detailed. Referring now to FIG. 1 the basics of a vertical bipolar NPN transistor structure 10 which results from conventional processing steps is shown. The basic structure 10 is comprised of a p-doped silicon structure 11, having a buried N+ subcollector 12 and N− epitaxial layer 13 thereon. The latter includes the vertical NPN transistor comprised of a N+ reach through region 14, a p-type base region 15 and a N+ emitter region 16. The structure is passivated with a composite insulating layer of silicon dioxide 17 of typical thickness of about 300 nm and silicon nitride 18 of approximate thickness 170 mm. Any thickness irregularities in layers 17 and 18 which stem from the thermal history, etc. of the semiconductor chip containing the device 10 during the prior processing steps have not been represented here to preserve clarity of illustration. The silicon nitride layer usually acts as an oxidation barrier to protect the top surface during trench sidewall oxidation. Any other desired active and/or passive devices would have been already incorporated into the structure at this stage of the process. Depending on the particular application, the buried N+ subcollector may be either a blanket layer or composed of discrete regions formed at desired locations of the chip, for example, at the location where a bipolar transistor or capacitor structure of the present invention is to be formed. Then, the exposed silicon is reactively ion etched in an atmosphere containing $SF_6$, $Cl_2$ and He to form deep and narrow trenches 19 by etching through the N− epitaxial layer 13, the N+ subcollector 12 and into the P− substrate 11 to produce the structure shown in FIG. 2. As illustrated in FIG. 2, the trenches define a mesa-shaped silicon region 20 where active and/or passive devices may be located. Trench formation may be accomplished also by other techniques such as those detailed in U.S. Pat. No. 4,381,953 to Ho et al. and copending application Ser. No. 566,693 filed Dec. 29, 1983 entitled "Trench Etch Process for Dielectric Isolation", by Goth et al., both of which are assigned to the present assignee. Both of these references are hereby incorporated herein by reference. The trenches 19 are typically about 6 microns deep, 2 microns wide and have near vertical (i.e., greater than 85° with respect to the horizontal) sidewalls. The design layout of the trenches 19 is such that it delineates a square-shaped central stud or mesa 20 (which contains above-mentioned NPN transistor) enclosed by trenches 19 (FIG. 2).

Following trench formation, if desired a standard ion implantation is conducted and boron is introduced at the bottom of the trenches 19 to create channel stop. The function of a channel stop is to avoid leakage between collector 12 in one mesa and its counterpart collector in an adjacent mesa due to inversion of the P− substrate 11 after forming the silicon dioxide layer 21.

Figure 3:
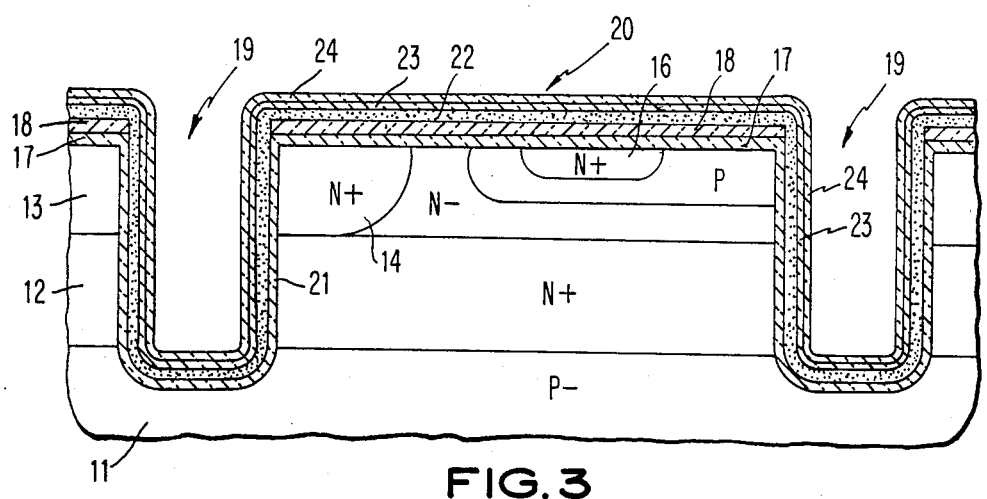

Referring to FIG. 3, the next sequence of process steps is the formation in the trenches 19 of the four-layer composite comsisting of the silicon dioxide 21, polysilicon 22, silicon dioxide 23 and silicon nitride 24. First, a thin oxide layer 21 having a thickness of about 30–100 nm is thermally grown to coat the sidewalls and floor of trench 19. Next, a doped polysilicon layer 22 is formed on the resulting structure. An exemplary process of forming polysilicon 22 is by low pressure chemical vapor deposition (LPCVD) at a temperature of about 620° C. obtaining about 200 nm to 300 nm thick blanket layer. This layer is then doped, for example, with phosphorous atoms to a high phosphorous concentration of $\geq$ about $5 \times 10^{19}$ atoms/cm$^3$ to increase the polysilicon conductivity and attain a low sheet resistivity of about 50–100 ohms/square. Alternatively, doped polysilicon may be directly deposited on the oxide layer 21. Next, the top surface of the polysilicon layer 22 is oxidized to form a thin silicon dioxide layer 23 of a thickness of about 50–100 nm. Lastly, a thin silicon nitride layer 24 of about 50–100 nm thickness is blanket deposited by chemical vapor deposition at a temperature of about 775° C. The nitride 23 serves as a passivating overcoat. It will be appreciated that the oxide 21 is grown only in the trench regions and not on the surface of the mesa 20 (which is protected from oxidation by the nitride layer 18). Consequently, while a four-layer composite (oxide 21 - polysilicon 22 - oxide 23 - nitride 24) is formed in the trench sidewalls and floor, a three-layer composite (polysilicon 22 - oxide 23 - nitride 24) is formed on the surface of mesa 20 which previously has been coated with oxide 17 and nitride 18.

The next process step is patterning of the composite layers. The pattern definition of this composite layer is preferably accomplished in a two-step lithographic process. First, a photoresist block out mask (not shown) is used to remove the silicon nitride layer 24 from all regions where capacitors are not desired. Layer 24 is isotropically etched to remove the nitride from the trench sidewalls as well as from the horizontal surface of the mesa. An organic underlay material such as polyimide (2.0–4.0 μm thick) is first applied (not shown)

onto the nitride layer 24 by spin coating. An inorganic barrier layer, for example SiOx, with a thickness in the 100 to 300 nm range is subsequently deposited in a CVD plasma. Polyimide is preferred over photoresist because it fills trenches without voids, is optically transparent, therefore allowing precise mask alignment, and lastly is thermally stable during deposition of the barrier layer. This step is followed by the application of a conventional photoresist such AZ 1340J (a trade name of Shipley Company), by spin coating. The photoresist layer, is exposed according to a desired pattern to ultraviolet light through a mask and subsequently developed, in a conventional manner. The block out photoresist layer is typically 0.7–1.5 μm thick to optimize exposed image quality. It is important in out particular embodiment that the opening in the block out mask be wider than the mesa as apparent from FIG. 2. This will assure subsequently that the desired portions of the sidewalls, the bottom of the trenches adjacent thereto and the top surface of the mesa be exposed, without tolerance problems. Additional details on photoresist block out mask step may be found in pending patent application Ser. No. 626,271 filed on June 29, 1984 entitled "Method of Selectively Exposing the Sidewalls of a Trench and its Use to the Forming of a Metal Silicide Substrate Contact for Dielectrically Filled Deep Trench Isolated Devices" by Goth et al. and assigned to the assignee of the present invention. This application is hereby incorporated by reference herein.

Figure 4:
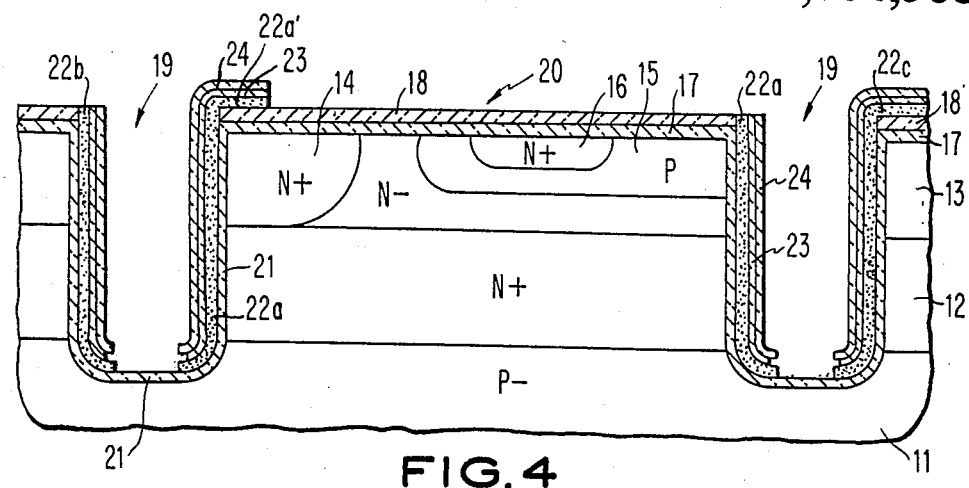

After defining the devices with capacitors in this fashion, next the capacitor contact is defined by employing a contact mask and the process using polyimide discussed above. According to the present embodiment, where a transistor/capacitor structure is to be formed in a mesa, the silicon nitride overcoat layer 24 is anisotropically etched at this process stage, selectively retaining the overcoat layer 24 only on the trench sidewalls where the trench capacitor is required and on a desired portion on the horizontal top surface of the mesa at the location of the subcollector region 14, to delineate the top surface contact of the capacitor. After stripping away the photoresist of the contact mask, the underlying silicon dioxide layer 23 and the N+ polysilicon layer 22 are, in turn, isotropically etched using the remaining portions of the nitride overcoat layer as an etch mask. Typical etchants include buffered HF for oxide removal and a solution composed of $CrO_3$, HF and $H_2O$ to etch the N+ polysilicon layer without significant attack of the overcoat nitride layer 24. The resulting structure is illustrated in FIG. 4. As a result of etching the polysilicon 22, the then silicon dioxide 19 corresponding to the bottom of the trenches will be exposed.

Due to obvious tolerance problems, it might be desirable that the contact mask not only overlap the trench sidewall as required, but also extends a little further in the trench. This process aspect has not been represented in FIG. 4.

As illustrated in FIG. 4, at this stage of the fabrication process, the polysilicon layer 22 is wrapped around the periphery of the mesa as a relatively thin coating on the vertical sidewalls of the mesa, leaving the trenches 19 available for filling with a dielectric medium. A preferred material for filling the trenches 19 is a material that is conducive for deposition at a low temperature. An example of this class of materials is plastic, more specifically, polyimide. This clearly distinguishes the present invention over the prior art according to which, the trench is filled with polysilicon. The use on a thin polysilicon layer instead of a solid polysilicon bar is considered as a primary feature of the present invention. Also, as is clear from FIG. 4 there is no continuity between the portion of the polysilicon layer 22 referenced 22a, which encompasses the mesa 20 and serves as the first electrode plate of the capacitor, and the other portions reference 22b and 22c, which pertain to other adjacent mesas. The portion 22a of the polysilicon layer 22 contains a small extension or tab 22'a just above the subcollector region 14. Tab 22'a will serve as a capacitor contact as will become more apparent later.

It is also a significant feature of the invention that the conductive polysilicon layer is formed only on the vertical sidewalls of the mesa-shaped, dielectrically isolated region 20. This allows each trench capacitor to be connected where desired. However in certain applications such as one-device dynamic RAM memory cell, it is desirable to have one plate of each capacitor connected to a common node of potential, such as the ground. In these applications, the conductive polysilicon layer may be left intact on the floor of the trenches, thereby providing a continuous polysilicon coating on the sidewalls of all mesa shaped isolated regions where a capacitor structure is to be formed.

Figure 5:
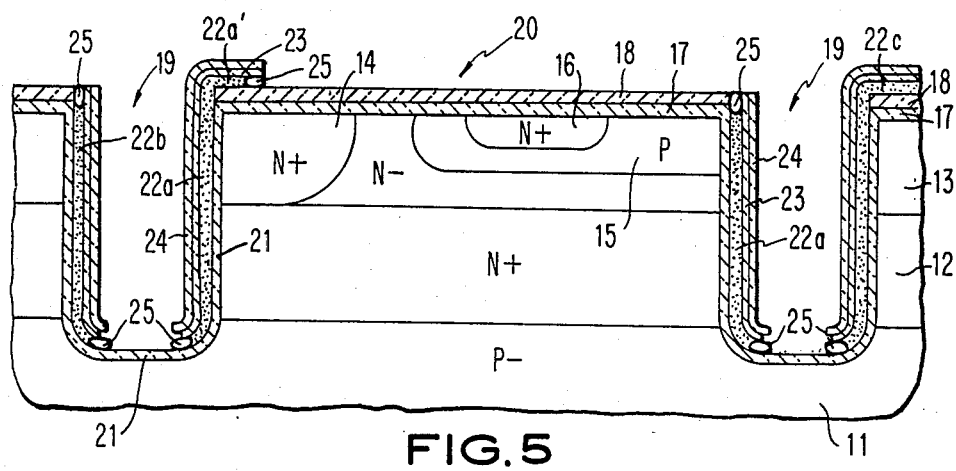

Next, passivation of the exposed edges of the remaining N+ polysilicon layer is achieved by thermal oxidation at a temperature, typically, in the range of 750°–850° C. As a result of this oxidation step, a number of structural changes would take place as shown in FIG. 5. First, due to the high dopant concentration present in the polysilicon portions 22a, 22b, 22c and 22a', protective oxide caps of thickness in the range 250–350 nm will be formed on the exposed edges of these polysilicon portions. Second, the oxide layer 21 at the bottom of the trenches becomes thicker. Third, an additional 50–80 nm thick oxide layer is grown increasing the trench sidewall insulator thickness at the trench locations not provided with a capacitor structure.

Figure 6:
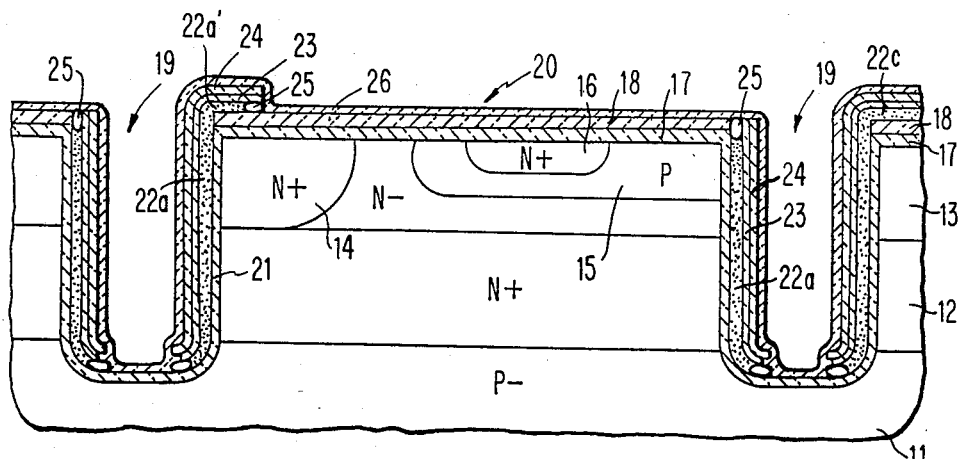

Device passivation is completed with the deposition of a blanket silicon nitride layer 26 as shown in FIG. 6. This layer is deposited in a CVD at a low temperature (approximately 750°–800° C.) to a thickness of about 50–150 nm. This layer provides a mobile ion passivation barrier for devices not provided with a capacitor structure. The next step is forming all device contacts including those at the bottom of all trench regions. This typically comprises to providing contact openings in correspondence with the silicon substrate regions that require either an ohmic or a rectifying contact. Openings are accomplished by $CF_4$ reactive ion etch of the exposed portions of the silicon nitride layers 26 and 18 and followed by wet etching in 7:1 BHF of the exposed portions of oxide layers 21 and 17 as illustrated in FIG. 7.

Figure 7:
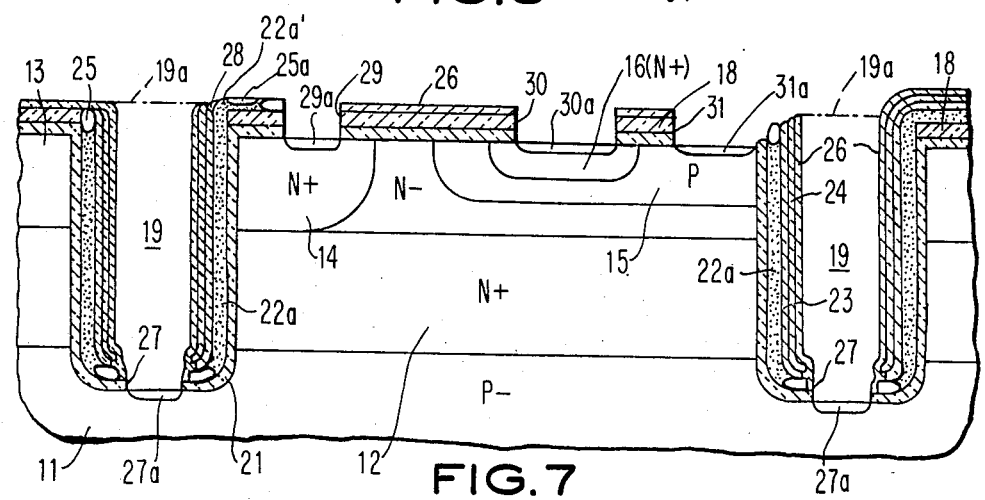

As shown in FIG. 7, five openings 27 through 31 are made, respectively, at the locations corresponding to the bottom of trenches 19, the capacitor contact 22a', the collector reach through region 14, the emitter region 16 and the base region 15. Metal silicide contact metallurgy is then formed in all exposed silicon and polysilicon regions including all device contacts, polysilicon capacitor contacts, and the bottom of all trenches. A thin layer of an appropriate contact metal is blanket deposited on the whole structure by sputter deposition. A silicide forming metal selected from the group comprised of platinum, palladium, and the like, is used. The preferred metal is platinum with a layer thickness in the range of 20–100 nm. The structure is then heated at about 550° C. to produce a platinum silicide layer whenever the platinum layer contacts silicon. The platinum silicide makes an ohmic contacts 25a, 29a, and 30a, respectively, with the N+ doped polysilicon capacitor contact 22a', the highly doped N+ type collector reach-through 14 and emitter region 16. The platinum silicide also forms an ohmic contact 31a with the base region 15 and rectifying contact 27a to the thin N− inversion layer which exists at the bottom of the trenches 19. It will be appreciated that to form the rectifying contacts 27a the platinum metal must penetrate beyond the thickness of the inversion layer. Unreacted platinum is removed by wet etching (in aqua regia). For additional details on this silicide process reference is made to pending application Ser. No. 626,278 filed on June 29, 1984, entitled "Metal Silicide Channel Stoppers for Integrated Circuits and Method for Making the Same" by G. Goth et al.

The processing at this point is substantially complete as far as the novelty of the invention is concerned. The balance of the processing is conventionally performed which includes filling of the trenches 19 with a dielectric material 19a such as polyimide by spin coating, baking at a suitable temperature to cure the polyimide and etching the unwanted polyimide by RIE using oxygen gas and standard personalization processing including metallization and passivation.

Figure 8:
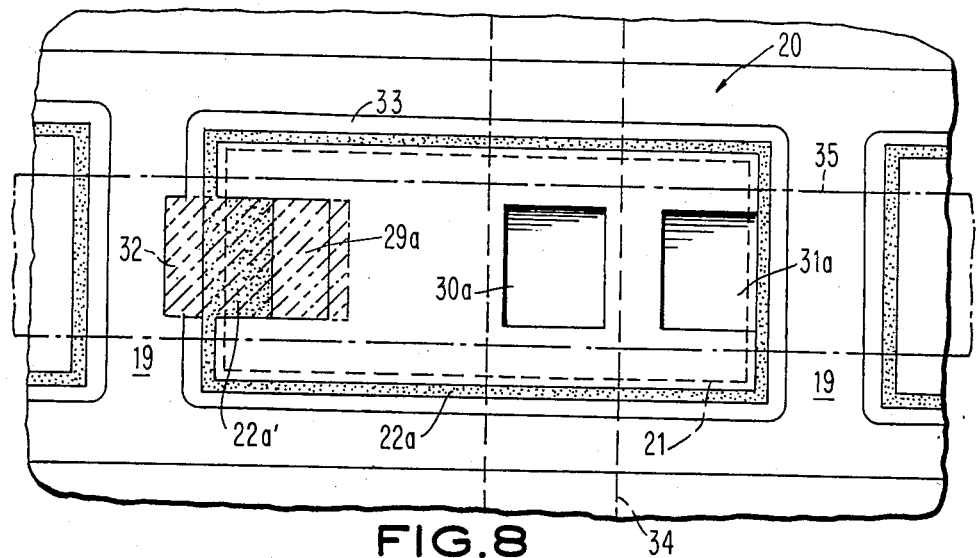
FIG. 8 shows a top view of the integrated structure of FIG. 7 illustrating the particular layout of the storage cell.

A top view of the final NPN transistor capacitor structure integrated in a mesa 20 resulting of the above processing is shown in FIG. 8. FIG. 8 represents a top view of the structure depicted in FIG. 7. In this particular embodiment where a NPN transistor is integrated with a capacitor to form a bipolar dynamic one device memory cell, the capacitor contact 22a' overlaps the subcollector region 14 and both are electrically connected by designing a metal stud 32 to short the capacitor to the collector of the transistor. In the case of a capacitor connected to the base region of the bipolar transistor, the polysilicon contact should overlap the base region.

The metal stud 32 is partly disposed above the deep polyimide filled trench 19 as shown in FIG. 8. As is evident from that FIG. 8, the polysilicon layer 22a is fully "wrapped" around the silicon mesa 20. The remaining composite silicon dioxide/silicon nitride layer which isolates the polysilicon layer from the polymide fill is designated by numeral 33. The word line 34 and the bit line 35 are, respectively, formed at the first and second levels of metallization.

The area of the capacitor is equal to the product of the mesa perimeter and trench depth. Typical capacitor area for dynamic memory application would be in the range of about 100–300 $\mu m^2$ yielding a capacitance in the range of about 0.1–1.0 pF for capacitor insulator thickness in the range of about 15–50 nm.

Figure 9:
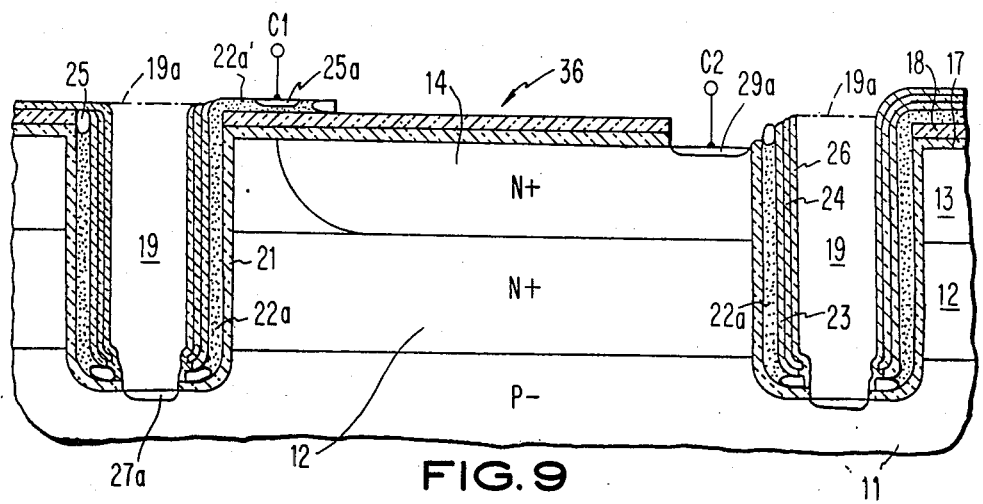
FIG. 9 shows a cross sectional view of the capacitor structure at the stage of FIG. 7 in an illustrative process of fabricating an isolated trench capacitor, for example, in peripheral circuits.

Turning now to FIG. 9, there is shown in this figure a second embodiment of the present invention. Specifically, FIG. 9 shows an embodiment of a discrete integrated capacitor structure 36 formed using the process described hereinabove. The capacitor structure 36 shown in FIG. 9 is comprised of a N+ buried subcollector 12 and a N+ reach through region 14. One capacitor contact (C1) is made to the polysilicon tab 22a' via ohmic contact 25a and the other contact (C2) is an ohmic contact 29a with the N+ reach through region 14. Alternative discrete capacitor structure may be readily designed. For example, the N+ reach through region 14 may be provided to occupy either a limited or entire portion of the epitaxial layer. Also, the buried layer 12 and the reach through region 14 may be merged into a single doped region coming in abuttment in the trench sidewalls, directly facing the polysilicon wrapping 22a inside the mesa-shaped isolated region of semiconductor (not represented), and separated from the polysilicon 22a by the thin oxide layer 21 forming the insulator of the capacitor structure. The formation of such a single doped region may be accomplished by conventional dopant diffusion or ion implantation. Such a discrete capacitor structure may be advantageously used for such analog applications as boot strap capacitors and series capacitors. It is noted that although for most applications the base of the mesa is generally rectangular or square in shape, as shown in FIG. 8, other shapes may be designed as well. For example, if a high capacitance capacitors are desired, serpentineor comblike, circular, and the like, structures can be formed to significantly increase the perimeter of the mesa.

Figure 11:
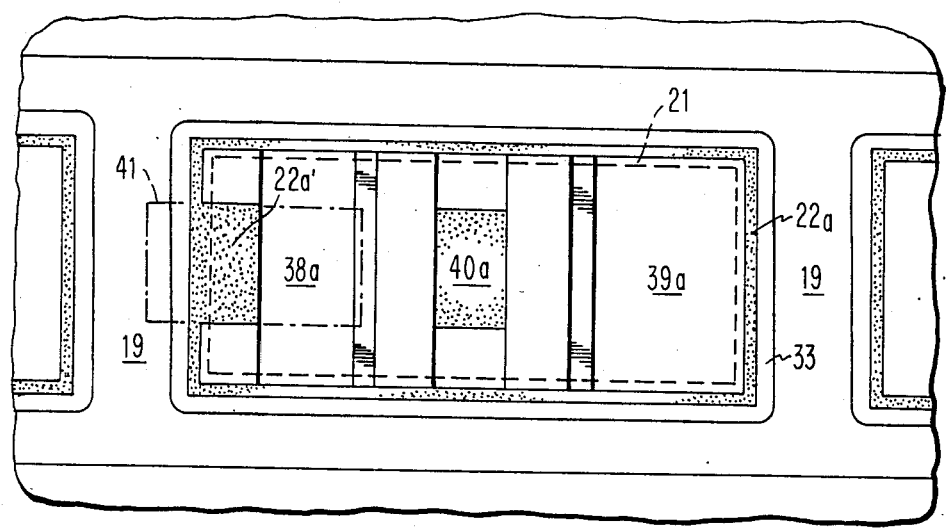
FIG. 11 shows a top view of the integrated structure of FIG. 10 illustrating the particular layout of the storage cell.
Figure 10:
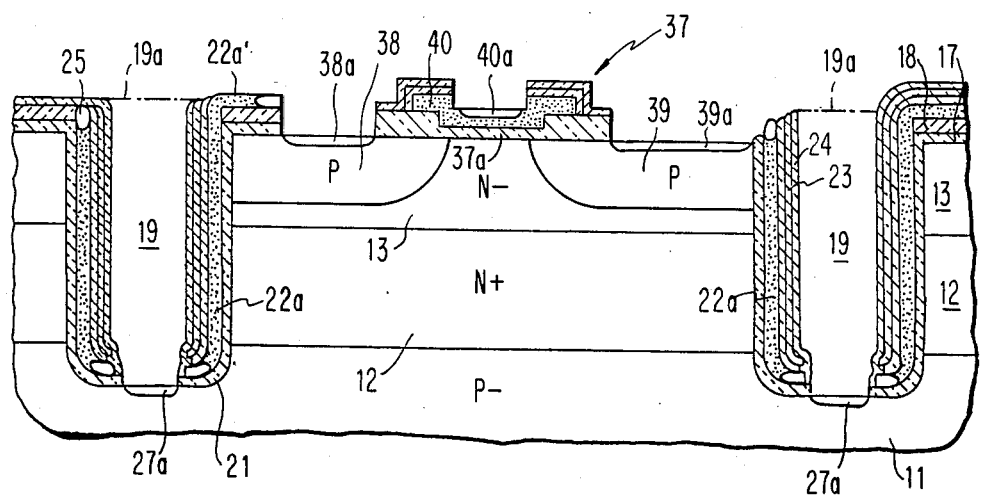
FIG. 10 shows a cross-sectional view of the capacitor structure at the stage of FIG. 7, as resulting from an illustrative process of fabricating dynamic one-device storage cell including a p-EET and trench capacitor combination structure in accordance with another embodiment of the present invention.

Focusing now on FIGS. 10 and 11, there is shown in these figures a third embodiment of the invention. FIGS. 10 and 11 show, respectively, the cross-sectional and top views, of a metal oxide field effect transistor (MOSFET) dynamic single device memory cell structure 37 having an FET (specifically, p-FET) integrated with a trench-incorporated capacitor manufactured in accordance with the present invention. The memory cell is produced using the basic process steps described hereinabove and just two additional masking steps. In FIGS. 10 and 11 identical references as those in, for example, used to identify like features. The source and drain regions referenced in FIG. 10 as 38 and 39, respectively, are formed in the counterpart of the process step used form the base 15 of the NPN transistor (FIG. 7).

Additional masking steps are then used to define the FET channel region and the polysilicon gate electrode 40 prior to NPN emitter doping and anneal. The FET channel region is formed by removing the field oxide (not shown) from the N− epi region 13 (FIG. 10) between the source 38 and drain 39 and regrowing a thin (approximately 20–50 nm) gate oxide 37a. The gate electrode 40 of the FET is formed by depositing an N+ doped polysilicon layer and patterning the polysilicon layer into electrode 40. The polysilicon gate 40 is then coated with a composite silicon dioxide-silicon nitride insulator layer prior to contact definition. Contacts to the source 38, drain 39, and gate 40 are then defined using the P contact mask for the NPN base, SBD anodes and P resistors. Metal silicide ohmic contacts 38a, 39a and 40a, respectively, with the source 38, drain 39 and gate 40, are then established as explained above by sputter deposition and sintering. A connecting stud 41 (shown in FIG. 11) makes the necessary connection between contacts 22a' and 38a.

Figure 13:
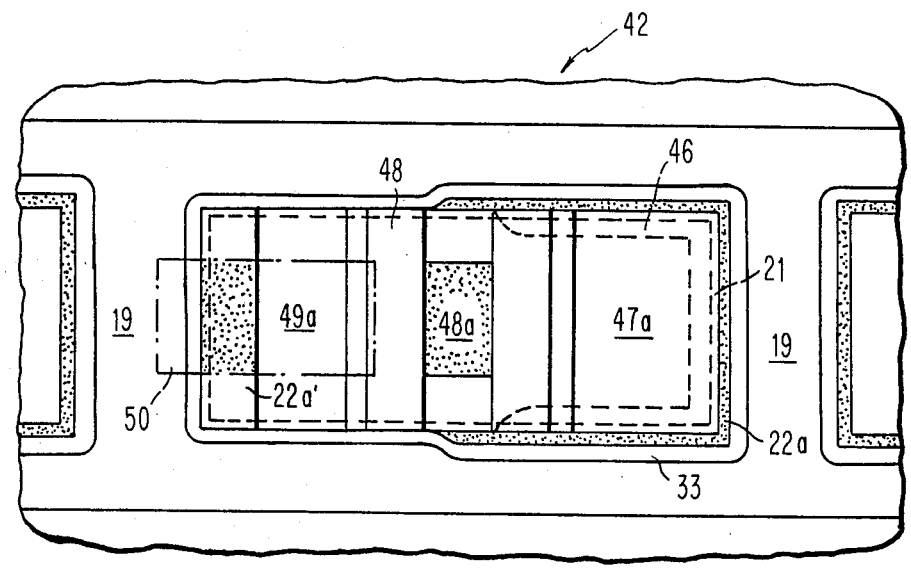
FIG. 13 shows a top view of the integrated structure of FIG. 12.
Figure 12:
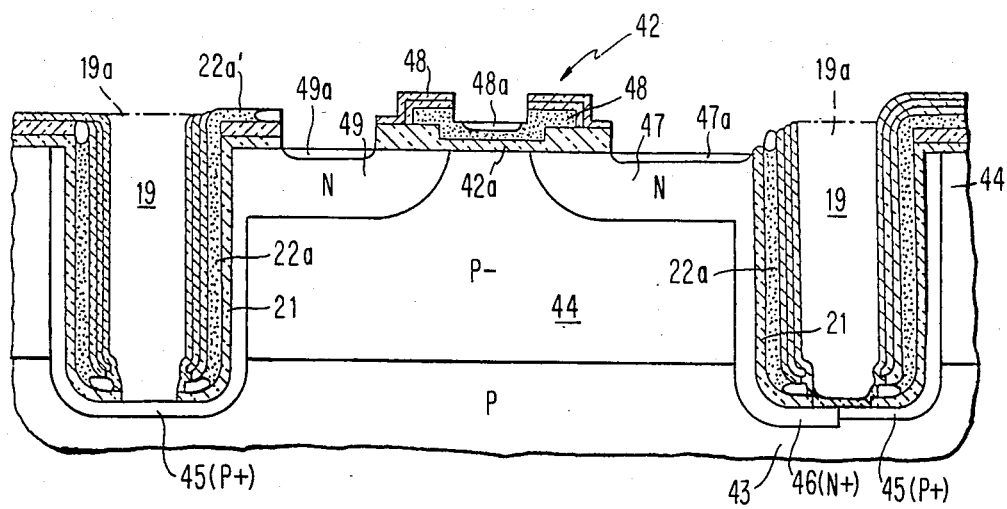
FIG. 12 shows a cross-sectional view of the capacitor structure at the stage of FIG. 7 obtained from an illustrative process of fabricating a FET dynamic one-device storage cell including an n-FET and capacitor combination structure in accordance with still another embodiment of the present invention.

Turning now to FIGS. 12 and 13, there is shown in these figures yet another embodiment of the invention. FIGS. 12 and 13 show, respectively, the cross-sectional and top views, of a FET dynamic single device memory cell structure 42 comprised of an N-type FET integrated with a trench-incorporated capacitor manufactured in accordance with the principles of the present invention.

In FIGS. 12 and 13, there is shown a P type substrate 43 having a P-type epitaxial layer 44 formed thereon. Patterned N+ buried regions (not represented) are present where subcollectors for NPN transistors are necessary. Trenches 19 are formed in a conventional manner, but P+ channel stop regions 45 are formed by p-type dopant diffusion into the bottom and sidewall portions of the trenches. The diffused channel stop 45 eliminates leakage between the source 38 located in one silicon mesa and the drain located in a neighboring mesa due to inversion of the P− epi layer following oxidation of the trench sidewall. Where a trench-incorporated capacitor is necessary, an N+ buried region 46 is additionally formed in the trench, in direct abutment with the trench sidewall. Region 46 is an N+ diffusion which provides an extension of region 47 down the trench sidewall. This sidewall diffusion serves as one plate of the trench capacitor. Details of the process for defining the N+ diffusion 46 are contained in the aforementioned U.S. Ser. No. 626,271. Region 46 is used as an electrode plate of the capacitor and comes in contact with the drain region 47 as shown in FIG. 12. The gate electrode and source are referenced in FIG. 12 by numerals 48 and 49, respectively. The metallurgical contacts with the drain, source and gate electrode are referenced by references 47a, 49a and 48a, respectively. Connecting stud 50 (FIG. 13) makes the necessary connection between contacts 22a' and 49a.

The trench-incorporated capacitor structure disclosed hereinabove is not only of a high capacitance (e.g., 0.1 pF or higher) due to its unique structure, but also the capacitor does not consume valuable chip real estate. Another advantage is that it may be integrated with a transistor without necessitating any additional area. Since the capacitor capacitance is the product of the trench depth and parameter of the mesa, not only high value capacitance may be obtained but also the capacitance value can be readily adjusted as desired. For example, for a mesa of a given planar dimension, the capacitance may be increased by going deeper into the silicon (for more active area).

The trench capacitor permits abuttment of elements of active devices (e.g. the emitter of a bipolar device) fabricated in conjunction with the capacitor fabrication directly against the trench sidewalls. Such butted arrangement further enhances the integrated circuit device density. Yet another advantageous feature is that the trenches may be filled with any desired dielectric material (e.g. polysilicon, polyimide, silicon dioxide) which is compatible with the desired dielectric isolation of other devices on the chip. A still further feature in that the polysilicon layer which serves as a first plate electrode for one trench capacitor is not connected to any other capacitor plate electrode or devices formed in adjacent mesa surfaces. This offers the dual advantage of reducing the leakage currents and the freedom to connect the two capacitor plates independently where desired without the imposition of a common node connection prevalent in the prior art structures. Finally, from a process standpoint, the disclosed process readily lends itself for easy adaptability in both bipolar and FET dynamic memory cell fabrication processes.

While there has been shown and described what is considered at present to be preferred embodiments of the present invention, it will be appreciated by those skilled in the art that modification of these embodiments may be made. It is, therefore, desired that the invention not be limited to these embodiments, and it is intended to cover in the appended claims all such modifications as fall within the true spirit and scope of the invention.

What is claimed:

1. A method of forming a high capacitance and low leakage mesa-shaped capacitor structure in a semiconductor structure comprising the steps of:

(a) providing a semiconductor structure comprised of a substrate of a first type of conductivity having an epitaxial layer of an opposite conductivity type formed thereon, said layer having a heavily doped buried region of said opposite type of conductivity, said buried region serving as an electrode plate of the capacitor structure, said buried region being provided with a reach-through region in correspondence with the locations where a capacitor is to be formed;
   (b) forming a pattern of substantially vertical isolation trenches extending from one surface of said structure into said substrate through said epitaxial layer, thereby delineating a plurality of mesa shaped isolated regions of semiconductor material;
   (c) thermally oxidizing the sidewalls of said trenches to provide silicon dioxide layer serving as the dielectric for said capacitor structure;
   (d) forming a thin layer of doped polysilicon on the resulting structure;
   (e) forming a dual passivating layer of silicon dioxide and silicon nitride, in order, on the resulting structure;
   (f) removing by using a photolithographic process the nitride-oxide-polysilicon composite layer from everywhere except the trench sidewalls and the horizontal top surface of the mesa to define the other electrode plate of the capacitor structure and a polysilicon tab of the said other electrode, said tab to be subsequently used as the contact area of said other electrode plate;
   (g) subjecting the resulting semiconductor structure to an oxidizing ambient to oxidize the exposed edge portions of the polysilicon layer;
   (h) removing the nitride-oxide dual layer at the location of said contact area to expose said polysilicon tab;
   (i) exposing a surface portion of said reachthrough region; and
   (j) making ohmic contacts with both said polysilicon tab and the reach-through region.

2. The method of claim 1 further including the step of filling said trenches for device isolation purposes with a material selected from a group consisting of polyimide, polysilicon and silicon dioxide.

3. The method of claim 2 wherein said substrate is of the P− type of conductivity.

4. The method of claim 3 wherein said epitaxial layer is P−type.

5. The method of claim 3 wherein said buried region is an N+ blanket layer formed at the lower portion of said epitaxial layer by heavily doping.

6. The method of claim 3 further comprising merging said buried region and said reach-through region into a single N+ region abutting the sidewalls of the trenches.

7. The method of claim 1 wherein the step (d) further comprises the steps of:

depositing a layer of intrinsic polysilicon by low pressure chemical vapor deposition to a thickness of about 200 nm; and
   doping the polysilicon layer with phosphorous dopant to reach a sheet resistivity of about 50–100 ohms/square.

8. The method as in claim 7 wherein the concentration of phosphorous is at least $5 \times 10^{19}$ atoms/cc.

9. The method as in claim 8 wherein the thickness of said capacitor dielectric is in the range of about 30–100 nm.

* * * * *